United States Patent [19]

Germaine et al.

[11] Patent Number: 4,829,469
[45] Date of Patent: May 9, 1989

[54] SECURITY SYSTEM FOR USE WITH ELECTRONIC POSTAGE METER TO PREVENT LOCK ERASURE OF DATA

[75] Inventors: Thomas Germaine, Trumbull; Paul C. Kroll, New Milford, both of Conn.

[73] Assignee: Pitney Bowes Inc., Stamford, Conn.

[21] Appl. No.: 397,395

[22] Filed: Jul. 12, 1982

[51] Int. Cl.$^4$ .............................................. G06F 12/16
[52] U.S. Cl. ...................................................... 364/900
[58] Field of Search ... 364/200 MS File, 900 MS File

[56] References Cited

U.S. PATENT DOCUMENTS 3,742,458  6/1973  Inoue ................................... 364/200
3,978,457  8/1976  Check .......................................... 4/4

*Primary Examiner*—David Y. Eng
*Attorney, Agent, or Firm*—Donald P. Walker; Melvin J. Scolnick; David E. Pitchenik

[57] ABSTRACT

An electronically operated postage meter includes a non-volatile memory for the permanent storage of security and financial data utilized in the operation of the meter. In the operation of the memory, a standardized two-bit control signal is employed for providing read, write and word-erase commands in addition to one further command, namely, a block-erase command, wherein the entire memory is cleared. To avoid unintentional erasure of the entirety of the stored data, as might occur in the event of a fault in a control circuit or computation circuit coupled to the memory, a control-line translation unit is coupled within a control line which connects a memory control circuit with the memory. The control-line translation unit comprises a logic gate and a feed forward path, the gate operation being transparent to three out of the total of four control signals. Thereby, only the block-erase signal is translated, or converted, to a harmless one of the other control signals, more particularly, to the read signal. Thereby, a block-erase signal does not occur inadvertently due to a failure in a control unit external to the non-volatile memory.

14 Claims, 3 Drawing Sheets

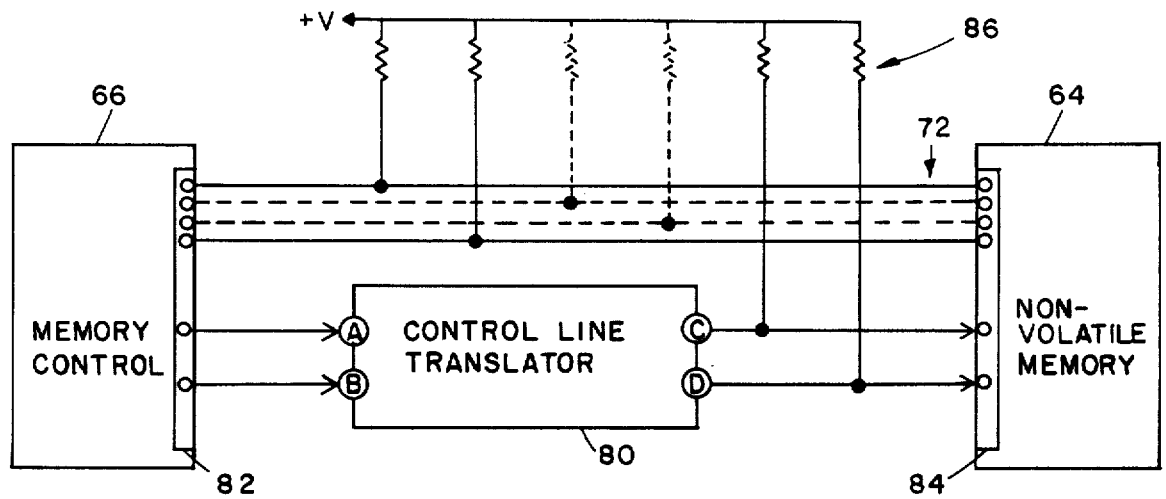
FIG. 4
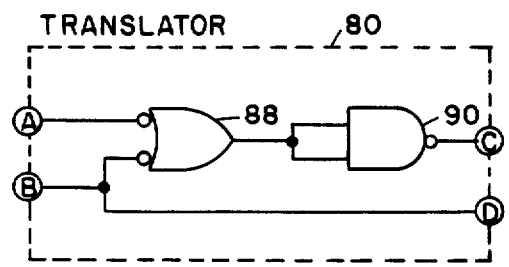
FIG. 5
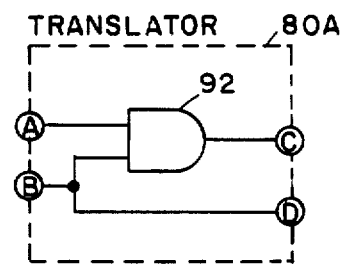
FIG. 7
| A | B |   | C | D |
|---|---|---|---|---|
| 0 | 0 | → READ → | 0 | 0 |
| 0 | 1 | → WRITE → | 0 | 1 |
| 1 | 0 | → BLOCK ERASE → | 0 | 0 |
| 1 | 1 | → WORD ERASE → | 1 | 1 |
FIG. 6

SECURITY SYSTEM FOR USE WITH ELECTRONIC POSTAGE METER TO PREVENT LOCK ERASURE OF DATA

BACKGROUND OF THE INVENTION

This invention relates to electronic postage meters, and is more particularly directed to an electronic postage meter of the type having a keyboard for the entry of postage to be printed, a display for displaying postage to be printed, and an electronic accounting device incorporating a non-volatile memory for the storage of postage information, the accounting device including a security feature for the prevention of unauthorized erasure of a complete block of the memory.

The invention is well suited to be incorporated into an electronic postage meter of the form disclosed in the U.S. Pat. No. 4,301,507, the disclosed postage meter incorporating an accounting board comprising a non-volatile memory, a microcomputer, and address-generation circuitry responsive to signals of the microcomputer for addressing the non-volatile memory.

The non-volatile memory is used for the permanent recordation of important information such as the amount of postage available, the amount of postage which has been used, and user coding signals which prevent unauthorized access to the postage meter. In particular, it is noted that the non-volatile memory retains the information even in the absence of electric power, such memory being constructed of, typically, MNOS circuitry. As is disclosed in the foregoing U.S. Pat. No. 4,301,507, such memory and the circuitry coupled thereto is enclosed within a metallic shield for the shielding against electromagnetic interference, thereby preventing accidental erasure of data which may be stored in the memory.

A problem arises in that great care must be taken to ensure that there is no alteration of the stored information, particularly no erasure of the entire block of the information, as might occur in the event of the malfunction of a circuit coupled to the memory. While all such circuits, including the foregoing microprocessor and the address-generation circuit well as the memory itself are carefully constructed so as to minimize any chance of failure which might affect the storage of information, nevertheless, it is the nature of electronic circuitry that there is always some chance, albeit a very small chance, that a malfunction could occur and that such malfunction might endanger the storage of the data in the memory.

One particular vehicle by which stored data may be lost arises in the nature of the control circuit for the memory. Typically, such memories are produced commercially as preformed packages with a predesignated arrangement of pins for electrical connection, which pins may be plugged into a socket. In particular, in order to ensure versatile operation of the non-volatile memory, a common address scheme and a common control scheme are provided for all the memories. The control scheme provides for a pair of control lines carrying a two-bit signal for designating four possible functions, namely, read, write, block-erase, and word erase. The selection of the particular function is provided by the control generation circuit in combination with the microcomputer.

The foregoing problem in the maintenance of the security of the stored information is, therefore, directly connected with the generation of the control signals for designating the foregoing four memory functions. In particular, it is noted that while the read and the write functions are continually used during the operation of the accounting board, and that while the word-erase function would be utilized whenever it is desired to update stored data, the block-erase function would never be used to erase the memory in view of its storage of a history file on the use of the postage meter.

It is apparent therefore, that in the event of a malfunction in the microcomputer or in the control generation circuit, which malfunction would inadvertently provide the two-bit control signal designating the block-erase function, then the non-volatile memory would become erased in its entirety. Accordingly, it may be understood that a substantial increase in the security of the operation of the accounting board, particularly with respect to the storage of data in the non-volatile memory, could be obtained if there were provided some form of security device which would prevent the presentation of the unauthorized block-erase signal at the memory.

SUMMARY OF THE INVENTION

The foregoing problem is overcome and other advantages are provided by a security device for a postage meter which accomplishes an important objective of the invention in the prevention of a presentation of an authorized block-erase control signal to the non-volatile memory storing the essential data for the operation of the postage meter. The security device of the invention takes the form of an electrical circuit which is interposed between the control generation circuit and the memory, the control lines designating the foregoing four memory functions applied to the security device.

An important feature of the circuit of the security device is the provision that it be transparent to the read, write, and word-erase functions, that is, that the control signals designating these functions be able to propagate freely through the circuit of the security device for presentation at the input terminals of the memory. However, in the case of the control signal designating the block-erase function, such control signal must be so modified that a harmless control signal, such as a read signal, is presented to the memory. Thereby, the security device acts as a control-line translator, wherein the control designation of the three useful functions are presented to the memory without change, while the control designation of the block-erase function is translated to the control designation of the read function. Thereby, in the event that the microprocessor and the control generation circuit inadvertently produce the block-erase signal, the signal is translated to the read signal before presentation to the memory. Accordingly, the memory is protected from the destructive effects of the block-erase signal.

BRIEF DESCRIPTION OF THE DRAWINGS

The foregoing aspects and other features of the invention are explained in the following description, taken in connection with the accompanying drawings, wherein:

FIG. 4 is a more detailed view of a portion of the accounting unit of FIG. 3 showing the interconnection of a memory control and a non-volatile memory via the control-line translator of the invention;

FIG. 5 is a schematic diagram of the electrical circuits of the control-line translator of FIG. 4;

FIG. 6 is a truth table showing the correspondence between input and output signals of the translator; and FIG. 7 is a schematic diagram of an alternative circuit of the translator.

DESCRIPTION OF THE PREFERRED EMBODIMENT

Figure 1:
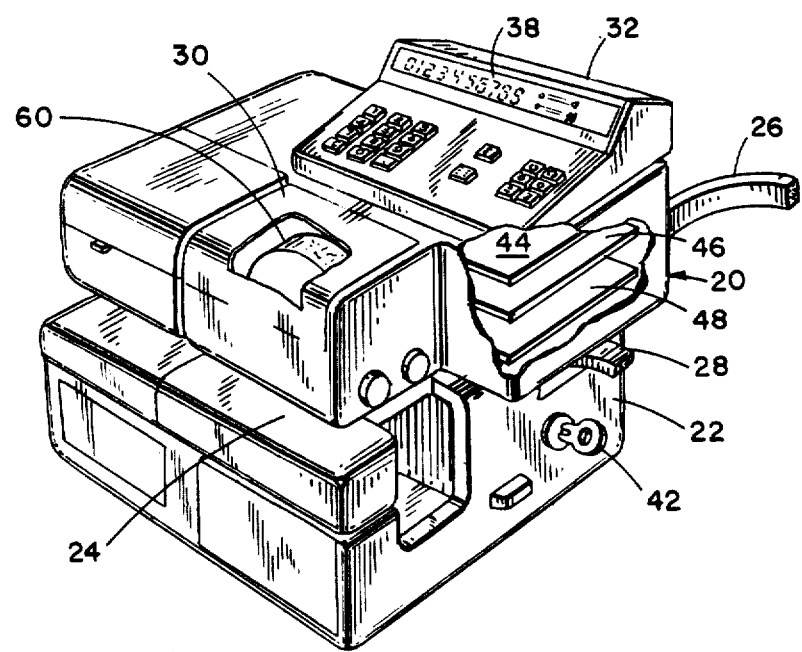
FIG. 1 is a perspective view of the postage meter incorporating the invention, a portion of the meter being cut away to show circuit boards wherein the invention is located.
Figure 2:
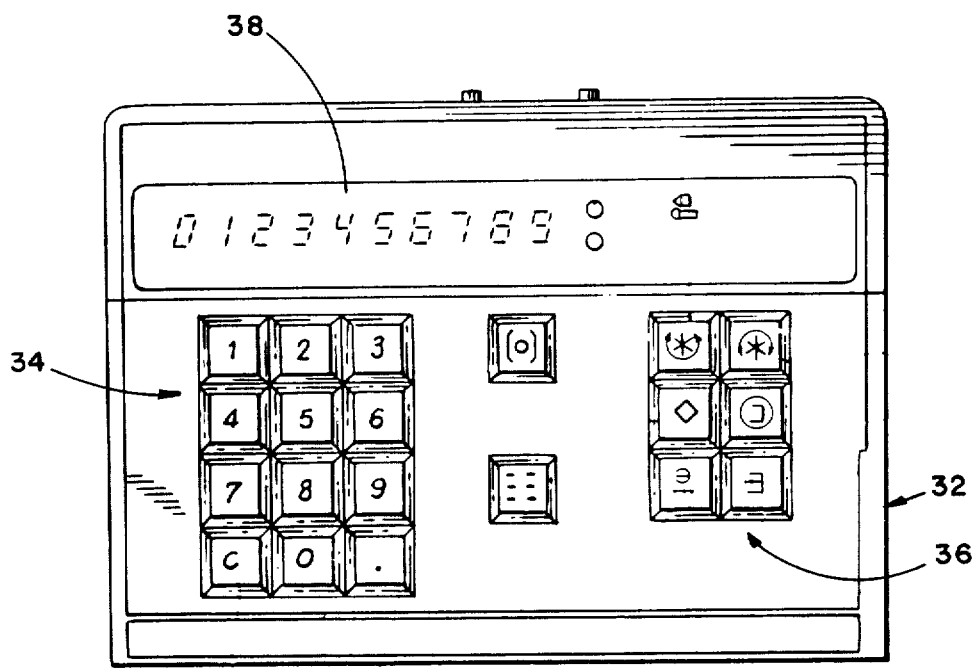
FIG. 2 is a plan view of a portion of the top of the meter of FIG. 1, the view of FIG. 2 showing a keyboard and display of the meter.

Referring now to FIGS. 1 and 2, there is shown a postage meter 20 incorporating the invention and supported by a base 22 to which it is removably affixed. A slot 24 is provided between the postage meter 20 and the base 22, at the forward edge thereof, for receiving envelopes or the like and the printing of postage thereon. Electric power for the energization of the postage meter 20 is coupled thereto by means of an electric power cable 26.

The postage meter 20 operates electronically, such a postage meter being described in the aforementioned U.S. Pat. No. 4,301,507. The base 22 may be of the type disclosed, for example, in U.S. Pat. No. 2,934,009, incorporating a mechanical drive for operation with the printing mechanism of the meter 20. The separability of the meter and the base 22 renders the meter 20 compatible with bases having conventional driving units, simplifies the servicing of the meter and, if necessary, simplifies the transportation of the meter for recharging. Electric power for operation of the mechanical drive (not shown) of the base 22 is coupled thereto via a power cable 28. The printer of the postage meter 20 is of a well known configuration (the mechanical details thereof not being shown in the figures) and is enclosed within a housing 30 of the meter 20 and disposed above the slot 24 for the imprinting of postage on articles passing through the slot 24.

The postage meter 20 includes a control panel 32 comprising a data entry keyboard 34, instruction keys 36, and a numeric display 38, such as a seven-segment LED or LCD type of display. The keyboard 34 is used for entering an amount of postage, which amount appears on the display 38. Further description of such panel is provided in the aforementioned U.S. Pat. No. 4,301,507. Keys 40 and 42 are employed to ensure usage of the meter 20 and base 22 only by authorized personnel.

Electronic circuitry for the operation of the postage meter 20 is located on circuit boards of which three such boards are shown in the cutaway portion of FIG. 1, the three boards containing the circuitry of a control unit 44, an accounting unit 46 and a printing unit 48. The circuitry of the control-line translator of the invention resides within the accounting unit 46. The foregoing circuitry is coupled to both the control panel 32 and the printer located within the housing 30. Thereby, the printer is activated by the foregoing circuitry to provide the correct amount of postage in accordance with the amount entered on the keyboard 34.

Figure 3:
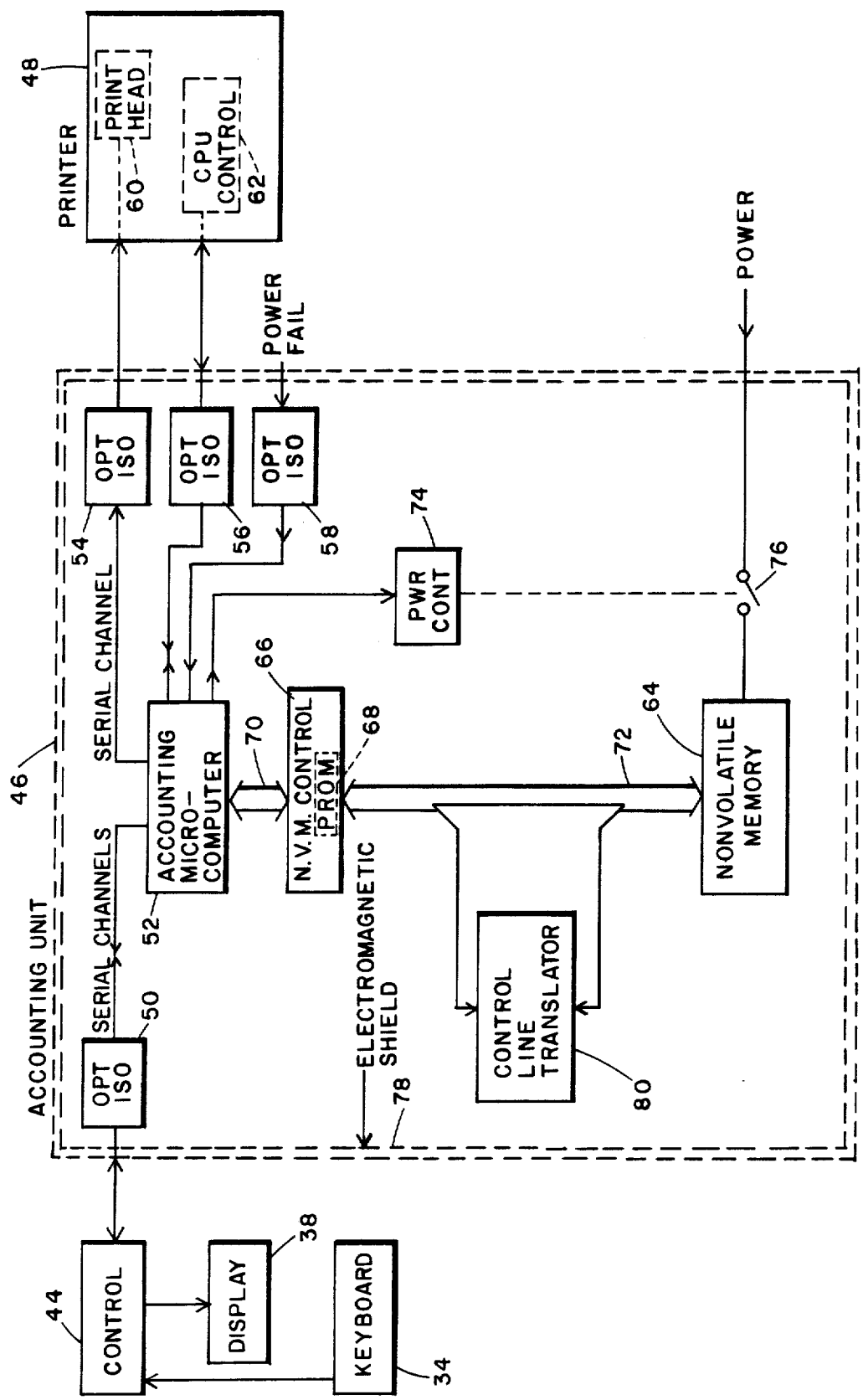
FIG. 3 is a block diagram of the electrical circuitry of the circuit boards of FIG. 1, FIG. 3 including a diagram of an accounting unit incorporating a control-line translator of the invention.

Referring also to FIG. 3, there are shown interconnections among the circuits of the control 44, the accounting unit 46 and the printer 48, as well as the interconnections of components of the accounting unit 46. Other details of the foregoing units are set forth in the aforementioned U.S. Pat. No. 4,301,507, which is incorporated herein by reference. As shown in FIG. 3, the control unit 44 is coupled to both the display 38 and the keyboard 34 whereby data entered on the keyboard 34 appears on the display 38. In addition, the control unit 44 is coupled to the accounting unit 46 by way of an electro-optic isolator within the accounting unit 46, which, as is well known, provides for the coupling of electric signals through conversion to optical signals, thereby removing the danger of surge voltages and currents of one unit from entering the next unit. The accounting unit 46 further comprises a microcomputer 52 coupled via electro-optic isolators 54, 56 and 58 to a print head 60, a central processing unit (CPU) 62, and to a power-fail circuit (not shown). The CPU 62 provides signals for control of the operation of the print head 60, the CPU 62 being located on a circuit board of the printer 48, while the print head 60 is located within the housing 30, as indicated with dashed lines in phantom in FIG. 1. The accounting unit 46 further comprises a non-volatile memory 64 and a controller 66 including a PROM (programmable read only memory) 68 for generating address signals to the memory 64 and for coupling data therefrom to the microcomputer 52. A bus 70 couples data and control signals between the microcomputer 52 and the controller 66, a bus 72 coupling address and data signals between the controller 66 and a non-volatile memory 64. A power control circuit 74 is responsive to signals applied thereto by the microcomputer 52 for operating a switch 76 to supply electric power to the memory 64 when required for the transferring of data into and out of the memory 64. The entire circuit of the accounting unit 46 is enclosed within an electromagnetic shield 78 which protects the components of the accounting unit 46 from electro-magnetic interference so as to ensure proper operation of the unit even in an environment of strong electrical discharge, such as that associated with lightning.

In accordance with the invention, the accounting unit 46 further comprises a control-line translator 80 through which the control lines of the bus 72 pass enroute to the memory 64. The translator 80 ensures during normal operation of the accounting unit 46, that no bulk erasure of the non-volatile memory 64 is to occur. Thereby, the translator 80 protects the memory 64 from such an inadvertent erasure of all the data contained therein, which erasure might otherwise occur by virtue of an inadvertent command of such an erasure by a malfunction of the controller 66, of a result of a malfunction in the microcomputer 52.

The non-volatile memory 64, at the present state of the art, is preferably in the form of an MNOS and does not require a backup-power source. While the memory 64 is capable of storing data over a period of years without the necessity of the application of external power for such storage, external power is to be applied to the memory 64 via the switch 76 during data transfer operations. As a further safety feature, the program of the microcomputer 52 is organized to enter the contents of registers within the computer, into the non-volatile memory 64 as soon as any indication of failure of the power supply occurs, and to restore this data to the working registers of the microcomputer 52 upon restoration of the power. The indication of such failure of power supply is coupled to the microcomputer 52 via the electro-optic isolator 58. As an example of a commercially available non-volatile memory employing the foregoing MNOS technology, such a memory suitable for use in the instant postal meter is produced by the General Instrument Corporation under part No. ER3400.

Such memories are manufactured with the intent that they be suitable for use in a variety of applications. Accordingly, they are made in modular form having a fixed number of leads, or terminals, which plug into a socket which is, typically, mounted on a printed circuit-board. The foregoing memory manufactured by General Instrument has a useful storage life of ten years without the need for an electronic refreshing of the stored data.

Two of the foregoing leads, or terminals, in the modular construction of the non-volatile memory are utilized for providing a two-bit control signal providing four separate control commands, namely, read, write, word-erase and block-erase.

Accordingly, it is readily apparent that an inadvertent activation of the block-erase address signal might cause substantial loss to the user of the postal meter since, by way of example, the amount of postage which he had bought would be lost. In addition, since the use of a postal meter incorporating an electronic security system involving the use of a predetermined code necessitates the presence of that code or a seed word thereof within the non-volatile memory, it becomes apparent that an inadvertent block-erase of the memory would prevent utilization of the meter since the meter would no longer respond to the user code.

While the electro-magnetic shield 78 of FIG. 3 provides for security against the intruding electro-magnetic fields strong external signals, still further security can be attained by assuring that no malfunction in the microcomputer 52 or in the controller 66 could ever cause a block-erasure of the non-volatile memory 64. In order to provide for this increased security, the control-line translator 80 alters the block-erase control signal to become one of the other control signals, more particularly, the read signal Thus, the translator 80 translates the block-erase signal to the read signal, while being transparent to the read, write and word-erase control signals so that these three signals pass through the translator 80 without any alteration. Thereby, upon an inadvertent occurrence of a block-erase signal, the translator 80 translates the block-erase signal to a read signal whereupon the memory 64 experiences the presence of a read signal, rather than the block-erase signal. In the event that a read, or write, or word-erase signal is applied by the controller 66 via the translator 80 to the memory 64, then the correct one of such control signals is applied at the control terminals of the memory 64.

Referring now to FIG. 4, the foregoing connection of the controller 66 with the memory 64 is explained in further detail. Individual lines of the bus 72 are shown being coupled between a terminal board 82 of the controller 66 and a terminal board 84 of the memory 64. In addition, a network 86 of pull-up resistors is shown coupled between a source of positive voltage (V) and the bus 72, individual ones of the resistors being coupled to individual ones of the lines of bus 72. Thereby, the signal on any one of the lines of the bus 72 is allowed to rise up to a relatively high value for indication of a logic 1 state, the circuitry of the controller 66 and the translator 80 driving the voltages of individual ones of the lines to a relatively low value to provide a logic 0 state. While the control signals proceed in the figure from the controller 66 to the memory 64, other ones of the lines in the bus 72 are connected to provide two-way communication, namely, from the controller 66 to the memory 64 as well as from the memory 64 to the controller 66.

Referring now to FIG. 5, there is shown one embodiment of the circuitry of the translator 80, the circuit comprising two logic gates 88 and 90. The input terminals of the NOR (negative logic) gate 88 are connected to the input terminals A and B, respectively, of the translator 80. The two input terminals of the NAND (positive logic) gate 90 are coupled together and to the output terminal of the gate 88. The output terminal of the gate 90 is complemented and is connected to the output terminal C of the translator 80. The input terminal B of the of the translator 80. As shown in FIG. 4, the input terminals A and B of the translator 80 are connected to the controller 66 while the output terminal C and D of the translator 80 are connected to the memory 64.

Referring also to FIG. 6, the operation of the control-line translator 80 is readily explained. Each row of the truth table of FIG. 6 corresponds to a different control signal, each control signal being a two-digit binary signal having the digits shown at the left side of the table of FIG. 6 in the column A and B. The signals at the output terminals C and D of the translator 80 are shown on the right side of the table of FIG. 6, their respective columns for the terminals C and D presenting the output logic states of the output signals corresponding to each control signal applied to the input terminals of the translator 80. With respect to the READ signal, and the first row of the table, it is seen that the input control and the output control of the translator 80 are the same, namely, 00. Thus, the operation of the translator 80 is transparent to the READ address signal. Similarly, the operation of the translator 80 is transparent to the WRITE address signal 01 in the second row of the table, and also with respect to the WORD ERASE signal 11 shown in the fourth row of the table With respect to the BLOCK-ERASE signal of the third row of the table, it is seen that the input control 10 is translated to the harmless READ control signal 00.

With reference to FIG. 7, there is shown an alternative embodiment of the translator, the alternative embodiment being identified by legent 80A. The translator 80A comprises an AND (positive logic) gate 92 wherein the input terminals of the AND gate 92 are connected to the input terminals A and B of the translator 80A and the output terminal of the gate 92 is connected to the output terminal C of the translator 80A. The input terminal B is also connected directly to the output terminal D as was the case in the embodiment of FIG. 5. With respect to the operation of the translator 80A, the truth table of FIG. 6 applies also to the circuit of FIG. 7, as well as to the circuit of FIG. 5. With respect to the embodiment of FIG. 5, it is noted that the NAND (positive logic) gate 90 is wired as simply an inverter for complementing the signal at the output terminal of gate 88. It is readily verified that a NOR (negative logic) 1 gate, such as the gate 88, having its output terminal complemented by an inverter, such as the gate 90 is logically equivalent to the AND (positive logic) gate 92. With either embodiment, the address translator 80 operates in a transparent fashion with respect to three of the control signals while translating the remaining signal, namely, the block-erase signal from the input control 10 to the output control 00.

It is to be understood that the above described embodiments of the invention are illustrative only and that modifications thereof may occur to those skilled in the art. Accordingly, this invention is not to be regarded as limited to the embodiments disclosed herein, but is to be limited only as defined by the appended claims.

What is claimed is:

1. In a postage meter comprising a keyboard for the entry of data, a printer for imprinting postage, and an electronic circuit coupling the keyboard with the printer, the improvement wherein the circuit comprises:
   a central processing unit coupled to said keyboard;
   a non-volatile memory; the non-volatile memory being controllable by control signals having logic states, the control signals including a block-erase signal, read signal, write signal and word erase signal, a programmable memory coupled to said processing unit for the development of control signals to said non-volatile memory in accordance with calculations performed by said processing unit with data supplied thereto by said keyboard; and control-line translation means coupled between said programmable memory and said non-volatile memory for altering the block erase signal to a control signal not commanding the block erase of said non-volatile memory, whereby the block erase signal is not available from said processing unit to control said non-volatile memory.

2. A postage meter according to claim 1 wherein said control-line translation means is transparent to control signals other than said block erase signal.

3. A postage meter according to claim 2 wherein said control-line translation means converts a block erase signal to the read signal to prevent unintentional block erasure of said non-volatile memory.

4. A security system for a data processing system incorporating a computation unit, a memory, and a control-line generator coupled between said computation unit and said memory for providing control signals having logic states to control said memory in response to signals applied by said computation unit to said control generator; the control signals comprising: a block erase signal, read signal, write signal and word-erase signal, said security system comprising a control translator coupled between said control generator and said memory for translating the block-erase signal to another control signal which does not produce block erasure, said control-line translator including circuitry which is transparent to control signals other than the block erase signal such that said other control signals retain their form upon passing through said control-line translator, whereby the block erase signal is not available from said computation unit to control said memory.

5. A security system according to claim 4, wherein the control translator comprises NOR and NAND gates being responsive to the signal from the input terminal of the control generator, the gates being operatively connected to each other whereby the output terminal of one gate is complemented by the other gate.

6. A security system according to claim 5, wherein the control signal provided by said control generator is a two-bit signal, and wherein said control-line translator has a by-pass line extending therethrough for one digit of said two-bit signal, said by-pass line connecting a first input terminal of said translator to a first output terminal of said translator, and wherein the signal of the second output terminal of said translator is formed by a combination of signals at two input terminals thereof by said gates.

7. A security system according to claim 4, wherein the control line translator comprises a NOR gate responsive to a control signal from the control generator and means operatively connected to an output terminal of the NOR gate for complementing the output terminal of NOR gate.

8. A security system according to claim 7, wherein the control signal provided by said control generator is a two-bit signal coupled via two lines from said control generator, each of said lines being coupled to respective ones of two input terminals one of which is coupled to one of said input terminals, while the second of said output terminals is connected for receiving the complemented output signal of said NOR gate.

9. A security system according to claim 8, wherein said control signal designating a block-erase is converted by said translator to a control signal designating a read function.

10. A security system according to claim 4, wherein the translator includes an AND gate with two inputs and an output, and wherein the translator has two input terminals and two output terminals, one of the input terminals being coupled to one of the output terminals, said two input terminals being coupled to the two input of the AND gate, and an output terminal of the translator, the input terminals of the translator being operatively connected to the control generator and the output terminals of the translator being operatively connected to the memory.

11. In a postage meter having a computation unit, a memory, and a control generator responsive to output signals of said computation unit for generating control signals for controlling said memory, a security device coupled between said control generator and said memory for converting a block-erase signal to another signal, and wherein said security device comprises:
   two input terminals for receiving two input control lines, two output terminals for supplying two lines of control signals to said memory, a logic unit coupled to said input terminals and to one of said output terminals, said logic unit including means for converting only one of four possible states of control signals by altering the state of logic at said one output terminal in response to the occurrence of said one state of control signals.

12. A postage meter according to claim 11, wherein the control signal designating a block-erase function is composed of a logic one signal at a first of said input terminals and a logic zero signal at a second of said input terminals, said second of said input terminals being coupled via a bypass line to the second of said two output terminals.

13. A postage meter according to claim 12, wherein said logic unit comprises an AND gate with two inputs and an output, the two inputs of the AND gate being connected to the input terminals and the output of the AND gate being connected to one of the output terminals.

14. A postage meter according to claim 12, wherein said logic unit comprises a NOR gate with two inputs and an output, and means for complementing the output terminal thereof coupled to the NOR gate, the complementing means having an output, the two inputs of the NOR gate being connected to the input terminals and the output of the complementing means being connected to one of the output terminals.

* * * * *

UNITED STATES PATENT AND TRADEMARK OFFICE
CERTIFICATE OF CORRECTION

PATENT NO. : 4,829,469

DATED : May 9, 1989

INVENTOR(S) : Thomas Germaine, Paul C. Kroll

It is certified that error appears in the above-identified patent and that said Letters Patent is hereby corrected as shown below:

On Cover page and column 1, change "LOCK" to -- BLOCK --;

On column 6, line 21, after "80", insert -- is also coupled directly to the output terminal D of the translator 80" --.

On column 6, line 65, after "(negative logic)" delete -- 1 --.

In claim 8, line 14, after "terminals", insert --of said translator, said translator including two output terminals,--.

Signed and Sealed this

Twenty-first Day of November, 1989

Attest:

JEFFREY M. SAMUELS

*Attesting Officer*   *Acting Commissioner of Patents and Trademarks*